United States Patent [19]

Isenberg et al.

[11] Patent Number: 4,609,562

[45] Date of Patent: Sep. 2, 1986

[54] APPARATUS AND METHOD FOR DEPOSITING COATING ONTO POROUS SUBSTRATE

[75] Inventors: Arnold O. Isenberg, Forest Hills Boro; Gregory E. Zymboly, Penn Hills Township, Allegheny County, both of Pa.

[73] Assignee: Westinghouse Electric Corp., Pittsburgh, Pa.

[21] Appl. No.: 684,438

[22] Filed: Dec. 20, 1984

[51] Int. Cl.[4] .............................................. C23C 16/22

[52] U.S. Cl. ........................................ 427/8; 118/692; 118/712; 118/715; 118/728; 118/732; 118/733; 427/255; 427/255.2; 427/255.3

[58] Field of Search ............... 118/692, 715, 712, 733, 118/728, 732; 427/8, 255, 255.3, 255.2

[56] References Cited

U.S. PATENT DOCUMENTS

| | | | |
|---|---|---|---|
| 4,154,192 | 5/1979 | Tsubouchi et al. | 118/715 |
| 4,287,224 | 9/1981 | Heimbach et al. | 427/255.3 |
| 4,371,587 | 2/1983 | Peters | 427/255.3 |
| 4,374,163 | 2/1983 | Isenberg | 427/255.2 |
| 4,466,380 | 8/1984 | Jansen et al. | 118/692 |
| 4,487,787 | 12/1984 | Shioya et al. | 427/8 |
| 4,501,777 | 2/1985 | Rose | 427/255.2 |

OTHER PUBLICATIONS

Isenberg, "Growth of Refractory Oxide Layers By Electrochemical Vapor Deposition (EVD) at Elevated Temperatures", pp. 572–583.

*Primary Examiner*—Sadie L. Childs
*Attorney, Agent, or Firm*—R. D. Fuerle

[57] ABSTRACT

Disclosed is an apparatus for forming a chemically vapor deposited coating on a porous substrate where oxygen from a first gaseous reactant containing a source of oxygen permeates through the pores of the substrate to react with a second gaseous reactant that is present on the other side of the substrate. The apparatus includes means for controlling the pressure and flow rate of each gaseous reactant, a manometer for measuring the difference in pressure between the gaseous reactants on each side of the substrate, and means for changing the difference in pressure between the gaseous reactants. Also disclosed is a method of detecting and closing cracks in the coating by reducing the pressure difference between the two gaseous reactants whenever the pressure difference falls suddenly after gradually rising, then again increasing the pressure difference on the two gases. The attack by the by-products of the reaction on the substrate are reduced by maintaining the flow rate of the first reactant through the pores of the substrate.

14 Claims, 1 Drawing Figure

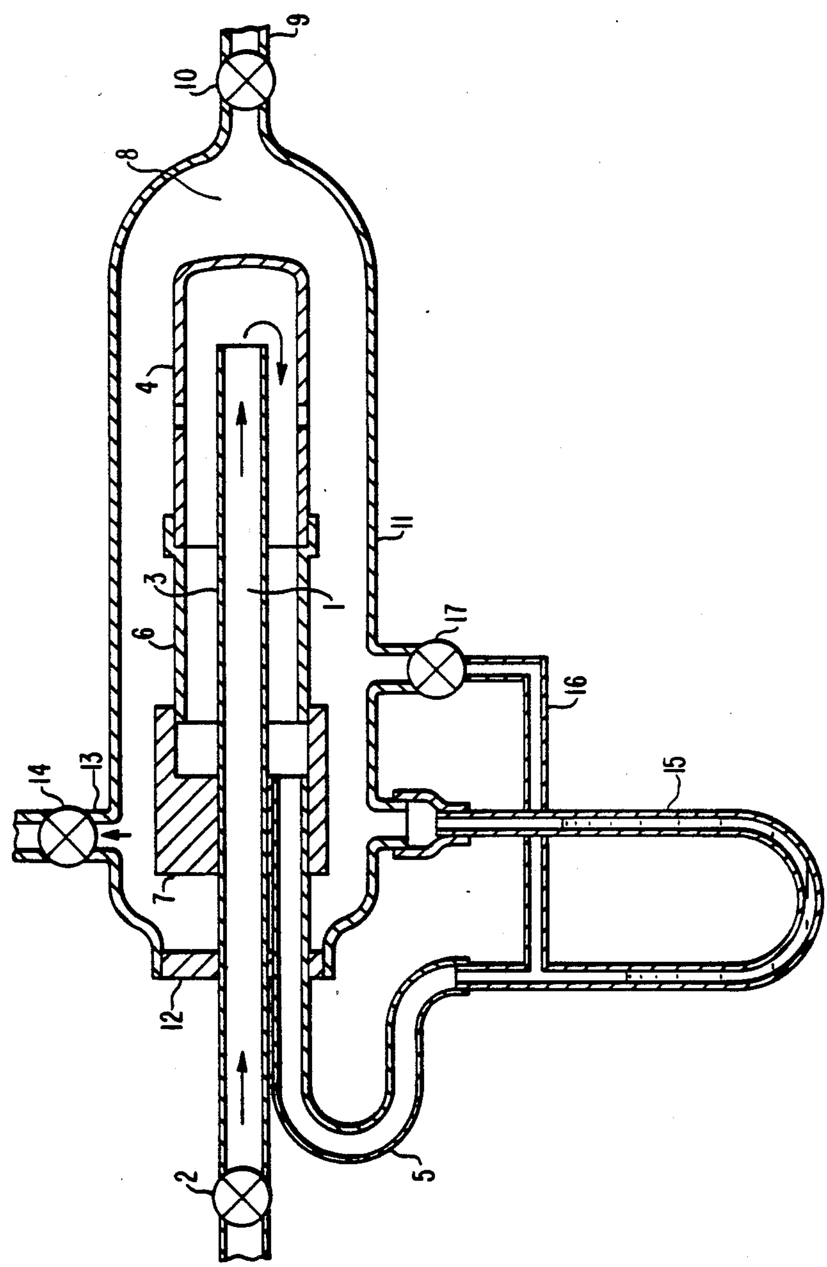
9
10
8
4
11
3
1
6
17
16
15
14
13
7
12
2
5

APPARATUS AND METHOD FOR DEPOSITING COATING ONTO POROUS SUBSTRATE

GOVERNMENT CONTRACT CLAUSE

The Government of the United States of America has rights in this invention pursuant to Contract No. DE-AC0280-ET17089, awarded by the U.S. Department of Energy.

BACKGROUND OF THE INVENTION

In the production of solid oxide electrochemical cells it is necessary to chemically vapor deposit thin (typically 1 to 200 microns) oxide layers onto a porous tube or substrate sealed at one end. The oxide layer can be the ionically conducting electrolyte, typically yttria-stabilized zirconia, or the electronically conducting interconnect, typically magnesium-doped lanthanum chromite, which connects one cell to another.

In this modified chemical vapor deposition process, a first reactant containing a source of oxygen permeates through the pores in the substrate material and reacts with a metal halide gas on the other side of the substrate, depositing a metal oxide coating on the substrate. As the metal oxide reaction product grows on the substrate, it closes off the pores in the substrate strictly by chemical vapor deposition (CVD). The coating continues to grow by electrochemical vapor deposition (EVD) because oxygen ion transfer from the source of oxygen through the growing oxide layer takes place.

This process is very sensitive and it is often difficult to produce a satisfactory product. One problem is that metal halide vapors and by-products of the reaction, namely, chlorine or hydrochloric acid, can attack the substrate before a protective coating has been formed. In addition, cracks in the substrate and coating can develop as it is being deposited, due to the above-mentioned side reactions with the substrate, and these cracks cannot be easily sealed as the coating continues to grow. While stronger and more conductive ceramic materials have been found which could be used in the cell as substrates, these materials cannot now be used because they are more subject to deleterious chemical side reactions with halides and reaction by-products, and exposure time of the substrate to reactants must be minimized.

SUMMARY OF THE INVENTION

We have discovered that these problems can be greatly alleviated by controlling the difference between the pressures of the reactant gases on the two sides of the substrate. By means of this control over the pressure on the gases, we have been able to greatly reduce the attack by metal halides, chlorine, and hydrogen chloride on the substrate. We have also found that by maintaining a higher partial pressure of oxygen in the first reactant during cooling we are able to greatly reduce cell fracture during cooling. By reducing the difference in the two pressures whenever a crack develops, we are able to promote growth in the crack and seal the crack.

RELEVANT ART

U.S. Pat. No. 4,374,163 describes a process of chemical vapor deposition where one of the reactants permeates through a substrate to react with the other reactant on the other side of the substrate and form a coating on the substrate.

DESCRIPTION OF THE INVENTION

The accompanying drawing is a diagrammatic side view in section of a certain presently preferred embodiment of the apparatus according to this invention.

In the drawing, a first gaseous reactant 1 containing a source of oxygen, such as free oxygen, water vapor, carbon dioxide, etc., passes through valve 2 and tube 3 into the bottom inside of a porous substrate tube 4. Excess reactant 1 can leave tube 4 by means of conduit 5. (This can be reversed, with the first gaseous reactant entering through the outside of tube 3 and leaving through the inside of tube 3.) The top of tube 4 is sealed by means of tube 6 and seal 7. The second gaseous reactant 8 of metal halides is admitted to the outside of tube 4 through conduit 9 controlled by valve 10. Envelope 11, sealed with seal 12, contains the second reactant around the tube 4. (Envelope 11 may enclose numerous tubes, which can be coated simultaneously, despite variations in the tubes.) Excess second gaseous reactant exits through conduit 13 and valve 14. A manometer 15 is connected between conduit 5 and the envelope 11 to measure the difference in pressure between first gaseous reactant 1 on the inside of tube 4 and second gaseous reactant 8 on the outside of tube 4. Another conduit 16, controlled by valve 17, permits the gases from the inside of tube 4 to pass to the outside of tube 4 without passing through the porous walls of tube 4, thereby reducing the difference in pressure between the two gaseous reactants. A more complete description of a solid oxide electrochemical cell tube can be found in U.S. Pat. No. 4,395,468, herein incorporated by reference.

The apparatus is operated in the following manner. The apparatus is first heated to the temperature range required for layer deposition, typically about 1000° to about 1400° C. Initially, valve 17 is closed or partially closed so that first gaseous reactant 1, admitted through tube 3 to the inside of tube 4, cannot pass through conduit 16 to the outside of tube 4. The walls of tube 4 are porous to first gaseous reactant 1 and the reactant permeates through these pores to the outside surface of tube 4 where it contacts second gaseous reactant 8, which is typically under a vacuum of about 0.1 to about 100 mm Hg. The resulting reaction produces a solid reaction product which grows on the outside of tube 4, gradually closing the pores in the walls of tube 4.

We have discovered that the attack of metal halide vapors and the by-products of this reaction on the porous substrate 4 can be greatly minimized if the pressure on the first gaseous reactant 1 inside tube 4 is sufficiently greater than the pressure on the second gaseous reactant 8 on the outside of tube 4. This difference in pressure between the two gases is preferably about 0.1 to about 200 mm of Hg. At lower pressure differentials the reaction by-products tend to attack tube 3 and at higher pressure differentials the resulting coating may be porous or otherwise have unsuitable properties. The use of inert carrier gases, for both gaseous reactants, is desirable. Such gases include argon, helium, or nitrogen. By diluting both reactants with inert gases, one gains another means of controlling reaction rates during pore closure. For instance, a 1 to 1 dilution of reactants with argon or helium results in good deposits; however, other widely varying ratios have been used with good results.

As the pores in tube 4 close, the manometer will gradually register a growing pressure difference between the gases on the inside and the outside of tube 4. After the pores have closed, a considerable gradient of oxygen activity is created across the growing deposit. This leads to the formation of electronic carriers in the deposit which allows oxygen ions to be conducted through the coating, so that deposition reactions continue to proceed and build up the coating on tube 4. If, however, a crack should occur in the coating, the manometer will register a sudden decrease in the pressure difference between the two gaseous reactants. When this occurs, valve 17 is opened, or partially opened, to permit a portion of first gaseous reactant 1 in the inside of the tube 4 to pass through conduit 16 directly to the outside of tube 4, further reducing the difference in pressure between the gases on the inside and outside of the tubes. This will cause the coating on tube 4 to begin to grow inside the crack instead of mostly on top of the already formed coating. As the crack gradually seals, the manometer will register a gradual increase in the pressure difference between the two gaseous reactants, and valve 17 can gradually be closed.

When the coating on tube 4 has formed to the desired thickness, the apparatus is gradually cooled back to room temperature. During cooling, the pressure on the first reactant can be maintained at a high level in order to prevent the loss of oxygen from the porous substrate, which is usually a conducting oxide electrode. Oxygen extraction can lead to expansion and subsequently to cracking and inferior properties. A partial oxygen pressure of at least 10 millimeters of mercury is maintained during cooling in order to prevent cracking when doped lanthanum manganite electrodes are part of the porous substrate.

If the process of this invention is used to form the electrolyte over an air electrode, the entire tube is coated, typically with yttria-stabilized zirconia (except for a thin strip along its length which is masked to form the interconnection between the cells). In that case, the first gaseous reactant is typically a mixture of water, oxygen, carbon dioxide, and a carrier gas. Initially, when the pores are open, the water reacts with the zirconium tetrachloride and yttrium trichloride to form the yttria-stabilized zirconia. While we do not wish to be bound by any theories, we believe that the equations which follow described the chemical reactions that occur.

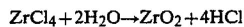

$$ZrCl_4+2H_2O\rightarrow ZrO_2+4HCl$$

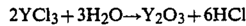

$$2YCl_3+3H_2O\rightarrow Y_2O_3+6HCl$$

This is a CVD process. Once the pores are closed, however, the process continues by an EVD process as oxygen ions react with the zirconium tetrachloride and the yttrium trichloride.

$$ZrCl_4+2O^{=}\rightarrow ZrO_2+4e^-+2Cl_2$$

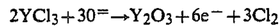

$$2YCl_3+3O^{=}\rightarrow Y_2O_3+6e^-+3Cl_2$$

The oxygen ions are formed when water or free oxygen reacts with electrons.

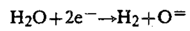

$$H_2O+2e^-\rightarrow H_2+O^{=}$$

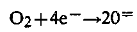

$$O_2+4e^-\rightarrow 2O^{=}$$

In forming the electronically conducting interconnection between the cells, the mask used during the forming of the electrolyte is removed and the entire tube is masked except for the still porous area where the previous mask was positioned. A typical interconnection material is magnesium-doped lanthanum chromite. This is formed in the same manner as the yttria-stabilized zirconia, using the appropriate mixture of chlorides such as lanthanum chloride, chromic or chromous chloride, and magnesium chloride. The product is both electronically and, to a very small degree, ionically conducting.

In addition to its application to the production of solid oxide fuel cells, the apparatus and process of this invention can also be applied to the production of electrolyzers and gas sensors.

The following examples further illustrate this invention.

EXAMPLE 1

An apparatus similar to that shown in the accompanying drawing was placed in a furnace so that porous substrate tube 4, was in the hot zone and valves 17, 14, and 2 and portions of the alumina carrier tube 6, were in a cool zone. The vacuum envelope 11 was then evacuated to nearly 0.1 mm Hg. At this point, valve 17 was open, thus equalizing the pressure inside and outside of tube 4. A gas mixture of approximately 40% water, 20% oxygen, and 40% carrier gas was passed through an oxygen sensor (not shown) so that oxygen activity could be monitored continuously. These gases were directed through tube 3 and exited through tube 5, finally returning to the vacuum envelope through valve 17.

The furnace was then heated to the deposition temperature of 1200° C. Once that temperature had been reached, valve 17 was closed, and all gases entering tube 4 had to pass through its porous wall.

At this point, a pressure differential was measured on manometer 15 which indicated the internal pressure required to force incoming reactants through the porous wall of tube 4. Typically, the pressure differential was in the range of 5 to 10 mm Hg.

Halide vapors were then introduced through conduit 9 at a rate of 0.65 g $ZrCl_4$/min and 0.1 g $YCl_3$/min, using argon carrier gas of about 100 $cm^3$/min. The gases passed over the exterior surface (100 to 200 $cm^2$) of tube 4 and reacted with the gases being forced through its porous walls from the inside.

With the introduction of the halide vapors, CVD of yttria-stabilized zirconia began. As the pores began to close, the once porous substrate became gas tight and further scale growth by the EVD mechanism took place. During this transition period, film growth was monitored and controlled by observing the pressure differential on the manometer and by manipulation of valve 17. As the pores closed, pressure began to rise in tube 4 and an increasing pressure differential was measured against time. After cooling, tube 4 was examined and showed no chemical attack. When it was subsequently made into a fuel cell, the cell performed efficiently.

When this experiment was performed without maintaining a pressure differential of about 10 to about 30 mm Hg, tube 4 was chemically attacked, often resulting in cracking during further cell processing.

EXAMPLE 2

In an experiment similar to Example 1, a sudden pressure drop of a few mm Hg was noted on the manometer, indicating that a crack had formed in tube 4. Valve 17 was opened, reducing pressure inside tube 4. After 30 seconds, valve 17 was partially closed. An increase in the pressure differential indicated on the manometer showed that the crack had been sealed with the yttria-stabilized zirconia. Subsequent examination of the tube showed that the crack had been filled. The tube was made into a fuel cell which performed effectively.

We claim:

1. In an apparatus for forming a chemically and electrochemically vapor deposited coating on a porous substrate where oxygen from a first gaseous reactant containing a source of oxygen permeates through the pores of said substrate to react with a second metal halide gaseous reactant that is present on the other side of said substrate, forming a metal oxide coating on said substrate, the improvement which comprises (1) means for controlling the pressure and flow rate of at least one gaseous reactant;

(2) a manometer for measuring the difference in pressure between said gaseous reactants;

(3) conduit means connecting one side of said manometer to said first gaseous reactant on one side of said porous substrate;

(4) conduit means connecting the other side of said manometer to said second gaseous reactant on said other side of said porous substrate; and (5) means for changing said difference in pressure between said gaseous reactants.

2. An apparatus according to claim 1 wherein said coating is stabilized zirconia.

3. An apparatus according to claim 2 wherein said first gaseous reactant is selected from the group consisting of water, carbon dioxide, oxygen, and mixtures thereof, and said second gaseous reactant comprises zirconium chloride doped with yttrium chloride.

4. An apparatus according to claim 2 wherein said first gaseous reactant is selected from the group consisting of water, oxygen, carbon dioxide, and mixtures thereof, said second gaseous reactant is selected from the group consisting of lanthanum chloride, chromous chloride, chromic chloride, and magnesium chloride.

5. An apparatus according to claim 1 wherein said substrate is a tube closed at one end.

6. An apparatus according to claim 5 wherein said means for controlling said pressure and flow rate are a seal at the open end of said tube having apertures for admitting said first gaseous reactant, and an enclosure surrounding said tube having means for admitting and releasing said second gaseous reactant.

7. An apparatus according to claim 1 wherein said means for changing said difference in pressure between said gaseous reactants is a conduit connecting said two sides of said substrate and a valve which controls the flow of said first reactant through said conduit.

8. An apparatus according to claim 1 wherein said first and second gaseous reactants are diluted with an inert carrier gas at a volume ratio of about 1 to 0.1 to about 1 to 10.

9. An apparatus according to claim 8 wherein said inert carrier gas is selected from the group consisting of argon, helium, nitrogen, and mixtures thereof.

10. An apparatus according to claim 1 including means for controlling the pressure and flow rate of each gaseous reactant.

11. An apparatus for forming a chemically and electrochemically vapor deposited coating on a porous substrate comprising (1) a sealed enclosure for said substrate;

(2) means for sealing one side of said substrate from the other;

(3) means for passing a first gaseous reactant containing a source of oxygen over one side of said substrate;

(4) means for controlling the pressure and flow rate of said first gaseous reactant over said one side;

(5) means for passing a second gaseous reactant over the other side of said substrate;

(6) means for controlling the pressure and flow rate of said second gaseous reactant over said other side;

(7) conduit means between said one side of said substrate and said other side of said substrate;

(8) means for controlling the flow of said first gaseous reactant through said conduit means; and (9) manometer means in said conduit means for measuring the difference in pressure between said one side of said substrate and said other side.

12. In a chemical and electrochemical vapor deposition process for forming a ceramic coating on a ceramic substrate wherein a first gaseous reactant on one side of said substrate permeates through pores in said substrate and reacts with a second gaseous reactant that is present on the other side of said substrate, closing said pores by forming said ceramic coating on said other side, a method of detecting the presence of breaks in said ceramic coating and of closing them, comprising (A) measuring the difference in pressure between said gaseous reactants on each side of said substrate;

(B) maintaining a higher pressure on said first gaseous reactant than on said second gaseous reactant; and (C) when said measurement of the difference in pressure increases then decreases, reducing then increasing the difference between the pressures on said two gaseous reactants.

13. In a chemical and electrochemical vapor deposition process for forming a ceramic coating on a ceramic substrate wherein a first gaseous reactant on one side of said substrate passes through pores in said substrate and reacts with a second gaseous reactant that is present on the other side of said substrate to form said ceramic coating and by-products which damage said substrate, a method of reducing the damage to said substrate from said by-products comprising maintaining a pressure difference of said first reactant across said pores of at least 0.1 mm of Hg.

14. In a chemical and electrochemical vapor deposition process for forming a ceramic coating on a porous substrate at elevated temperatures wherein a first gaseous reactant which includes a source of oxygen on one side of said substrate passes through pores in said substrate and reacts with a second gaseous substrate that is present on the other side of said substrate to form said ceramic coating, a method of preventing said porous substrate from cracking when said substrate is cooled, comprising maintaining a partial pressure of oxygen on said first gaseous reactant as said substrate is cooled of at least about 1 mm of Hg.

* * * * *